United States Patent
Chen

(10) Patent No.: US 6,822,877 B2
(45) Date of Patent: Nov. 23, 2004

(54) EMC SHIELD FOR EXPANSION SLOTS

(75) Inventor: Yun Lung Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/764,064

(22) Filed: Jan. 22, 2004

(65) Prior Publication Data

US 2004/0150972 A1 Aug. 5, 2004

(30) Foreign Application Priority Data

Jan. 22, 2003 (TW) ...................................... 92201182 U

(51) Int. Cl.[7] .......................... H05K 7/14; H05K 7/18; H05K 1/14; H05K 9/00
(52) U.S. Cl. ...................... 361/801; 361/740; 361/759; 361/816; 361/818; 174/35 R
(58) Field of Search ................................ 361/732, 740, 361/741, 747, 752, 753, 756, 759, 796, 799, 800–802, 816, 818; 174/35 R, 35 GC

(56) References Cited

U.S. PATENT DOCUMENTS

| 5,679,923 | A | 10/1997 | Le |
| 6,058,025 | A | 5/2000 | Ecker et al. |
| 6,182,835 | B1 | 2/2001 | Chen |
| 6,618,271 | B1 * | 9/2003 | Erickson et al. ............ 361/818 |

FOREIGN PATENT DOCUMENTS

| CN | 99240664.1 | 9/2000 |
| TW | 264067 | 11/1995 |

* cited by examiner

Primary Examiner—Phuong T. Vu
(74) Attorney, Agent, or Firm—Wei Te Chung

(57) ABSTRACT

An EMC shield (10) attachable to a rear panel (40) of a computer enclosure defines a number of elongated openings (12) and forms a number of bars (14) alternating with the openings. The EMC shield includes at least one hook (20) folded back from the EMC shield at one side of at least one opening for engaging with the rear panel, a number of arch-shaped strips (16) protruding outwardly and forwardly on said bars, and a number of tabs (18) protruding outwardly and rewardly on said bars alternating with the strips.

10 Claims, 5 Drawing Sheets

EMC SHIELD FOR EXPANSION SLOTS

BACKGROUND OF THE INVENTION

1. Field of the Invention

The present invention relates to ElectroMagnetic Compatibility (EMC) shields, and particularly to an EMC shield for shielding expansion slots in a rear panel of a computer enclosure to reduce leakage of electromagnetic radiation.

2. Prior Art

In the enclosure of a typical personal computer, there are generally kinds of electronic components such as Central Processing Units (CPUs) and accelerated chips mounted therein. The electronic components may emit electromagnetic radiation as operating. Computer systems are manufactured with expansion slots to allow peripheral devices to be added to the systems, so most of the electromagnetic radiation will leak out through the expansion slots to potentially interfere with other electronic components.

Typically, a plurality of cover plates is attached to a rear panel and block the expansion slots thereon. However, as the internal circuitry of computers has advanced, the cover plates can be inadequate to block the electromagnetic radiation. The inadequacy of the cover plates is believed to be due to gaps between the cover plates and the computer enclosure.

To overcome these shortcomings, conventional EMC shields are disclosed in Taiwan Patent Application No. 84209619. Each EMC shield is discrete and is mounted on a corresponding strip between two expansion slots. Two holes are defined in each strip. Each EMC shield is made with size according to the corresponding strip. Two brims are formed toward each other from opposite sides of each EMC shield for packing the corresponding strip. Two hooks are formed on each EMC shield corresponding to the holes of the strip, and a plurality of elastic tabs is stamped from each EMC shield. A plurality of cover plates is secured to the expansion slots and presses the tabs of the EMC shields to prevent electromagnetic radiation from leaking out. However, the discrete strips must be mounted to the strips one by one, which is cumbersome and time-consuming.

A typical computer enclosure EMC shield 10', as shown in FIG. 5, is integrally made by stamping a rectangular metal sheet. A bent portion 20' extends perpendicularly from one end of the EMC shield 10'. A plurality of fixing holes 18' is defined in the bent portion 20' of the EMC shield 10'. The EMC shield 10' defines a plurality of elongated openings 12' and forms a plurality of beams 14' alternating with the opening 12'. A plurality of tabs 16' is stamped from the beams 14'. In pre-assembly, screws must be used to fasten the EMC shield 10' to a rear panel of the computer enclosure via the fixing holes 18', which is cumbersome and time-consuming. This will lower the assembly efficiency.

Thus, an improved EMC shield which overcomes the above-mentioned problems is desired.

BRIEF SUMMARY OF THE INVENTION

Correspondingly, an object of the present invention is to provide an EMC shield that can reduce leakage of electromagnetic radiation through a computer enclosure.

Another object of the present invention is to provide an EMC shield that is easy to be assembled.

To achieve the above-mentioned objects, an EMC shield attachable to a rear panel of a computer enclosure defines a number of elongated openings and forms a number of bars alternating with the openings. The EMC shield includes at least one hook folded back from the EMC shield at one side of at least one opening for engaging with the rear panel, a number of arch-shaped strips protruding outwardly and forwardly on said bars, and a number of tabs protruding outwardly and rearwardly on said bars alternating with the strips.

Other objects, advantages and novel features of the present invention will be drawn from the following detailed description of a preferred embodiment of the present invention with the attached drawings, in which:

DETAILED DESCRIPTION OF THE INVENTION

Figure 1:
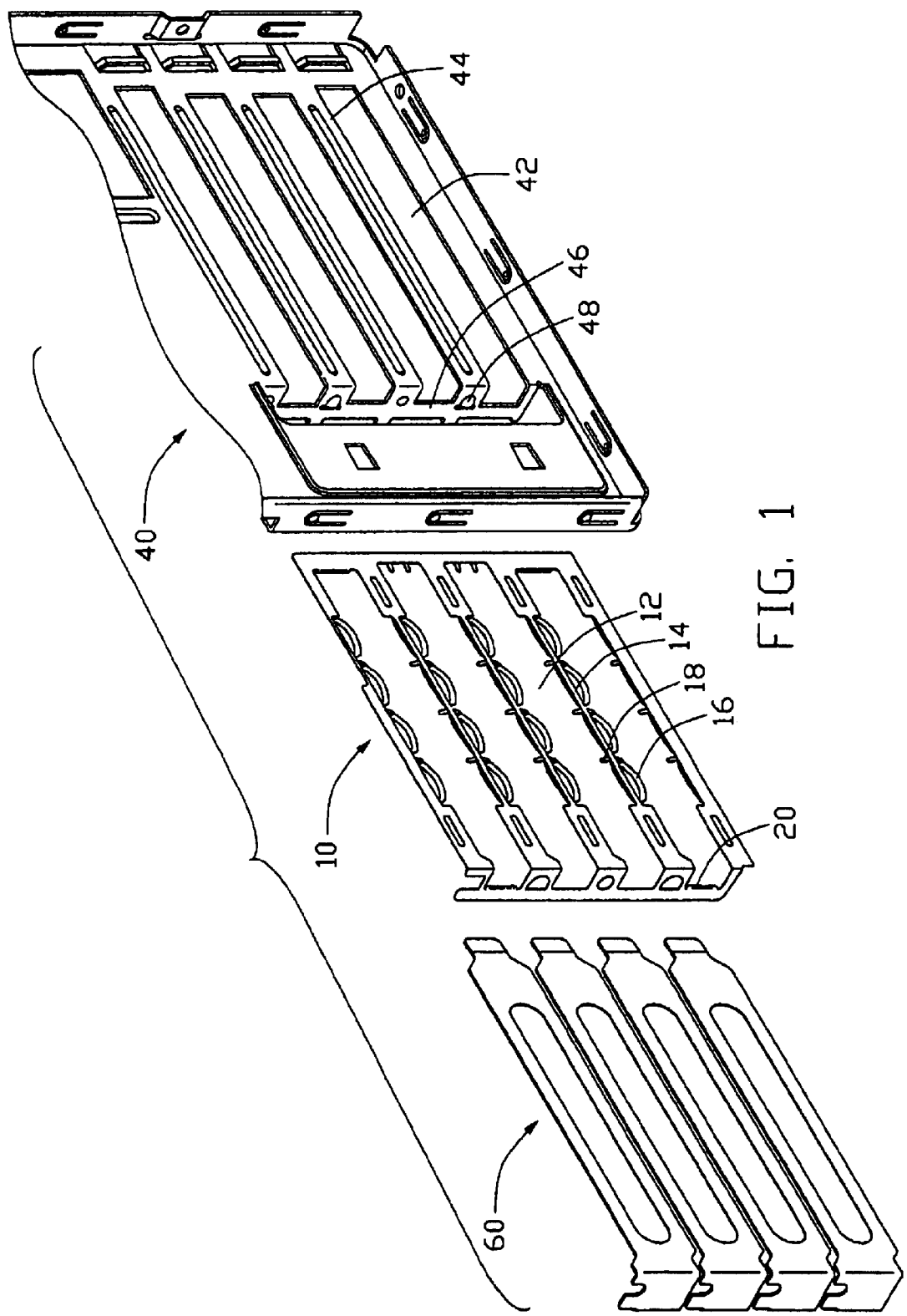
FIG. 1 is an exploded isometric view of an EMC shield in accordance with the preferred embodiment of the present invention, together with a plurality of cover plates and a rear panel of a computer enclosure.
Figure 2:
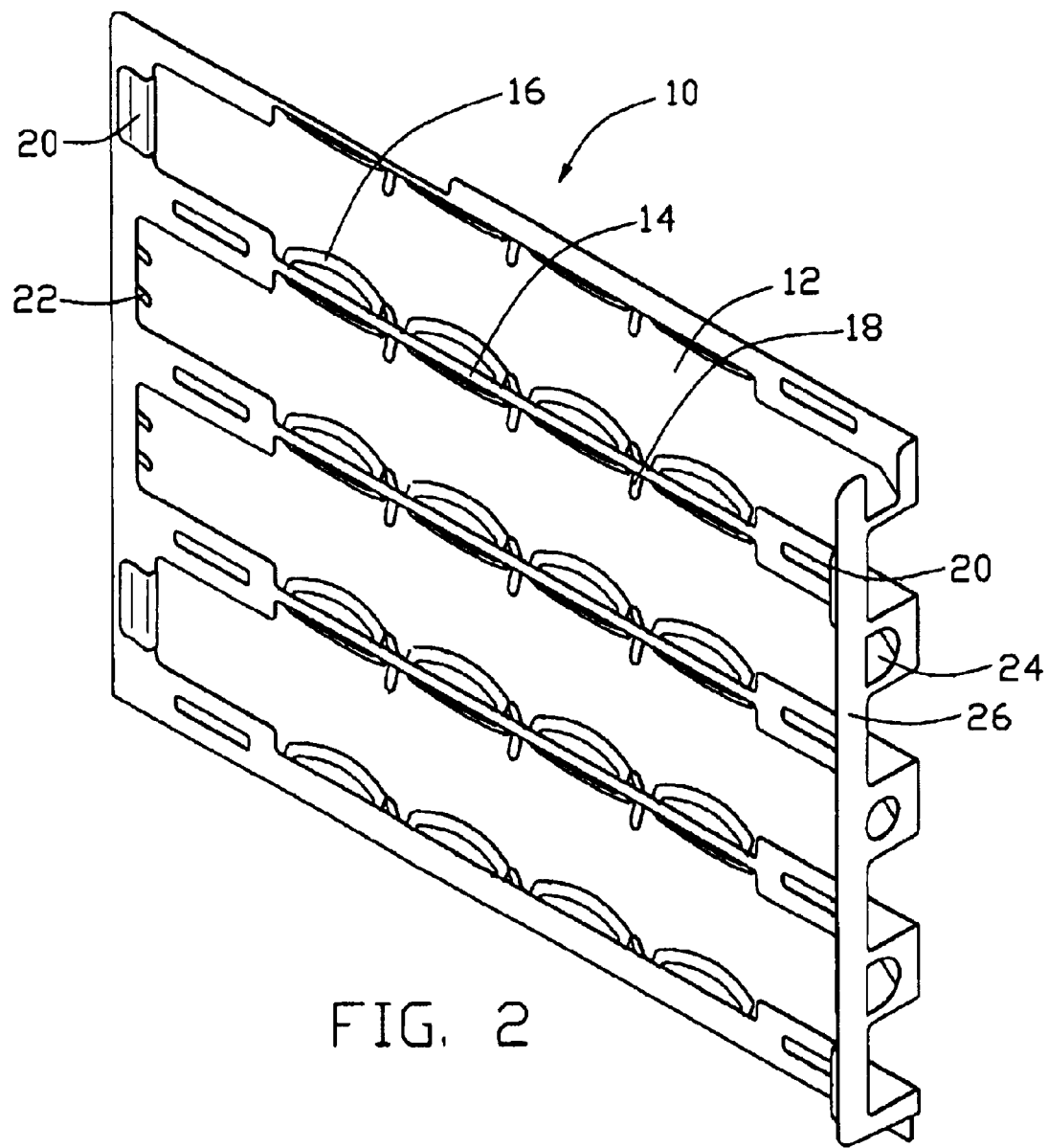
FIG. 2 is an isometric view of the EMC shield of FIG. 1, but viewed from another aspect.

Referring to FIGS. 1 and 2, an EMC shield 10 for reducing leakage of electromagnetic radiation through a computer enclosure, in accordance with a preferred embodiment of the present invention, is mounted between a rear panel 40 and a plurality of cover plates 60.

The rear panel 40 defines a plurality of expansion slots 42 and forms a plurality of beams 44 alternating with the expansion slots 42. A first bent portion 46 is perpendicularly formed rearwardly from one common end of the beams 44. The expansion slots 42 extend to one part of the first bent portion 46. Two fixing protrusions 48 protrude outwardly from the first bent portion 46 respectively between two expansion slots 42.

The EMC shield 10 is integrally formed by a rectangular metal sheet. A second bent portion 26 perpendicularly extends from one side of the EMC shield 10. The EMC shield 10 forms a plurality of bars 14 and defines a plurality of elongated openings 12 alternating with the bars 14. The openings 12 extend to one part of the second bent portion 26. A plurality pairs of symmetric arch-shaped strips 16 protrudes slantingly forwardly from both edges of each bar 14. A plurality pairs symmetric of tabs 18 protrudes slantingly rearwardly from both edges of each bar 14 alternating with the arch-shaped strips 16. A plurality of flakes 22 protrudes slantingly rearwardly from the other side of the EMC shield 10 in some openings 12. Two pairs of hooks 20 are folded back from the EMC shield 10 at opposite sides of the rest openings 12. Two fixing holes 24 are defined in the second bent portion 26 corresponding to the fixing portions 48 of the rear panel 40.

Figure 3:
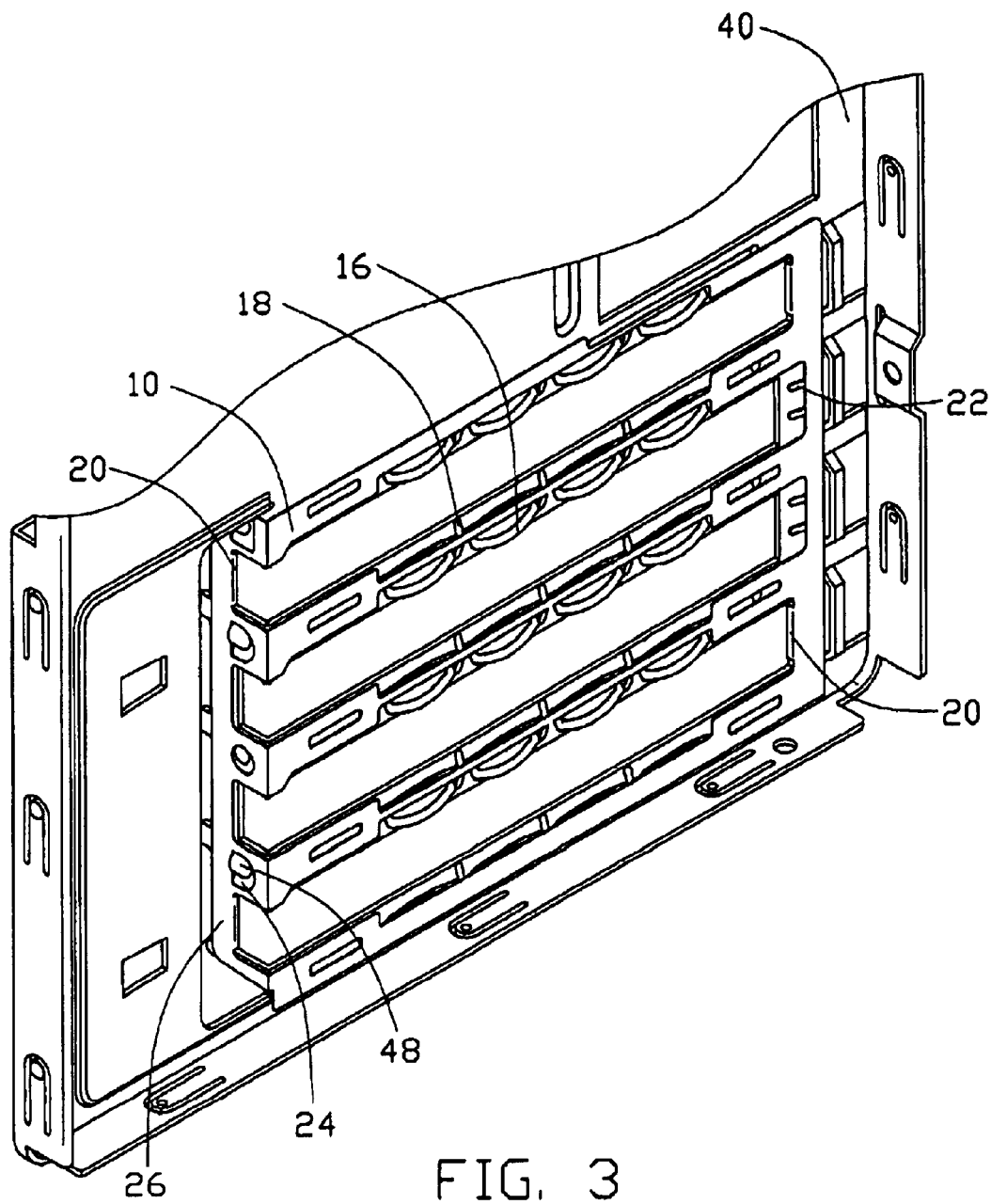
FIG. 3 is an pre-assembled view of FIG. 1, without coverage of the cover plates.
Figure 4:
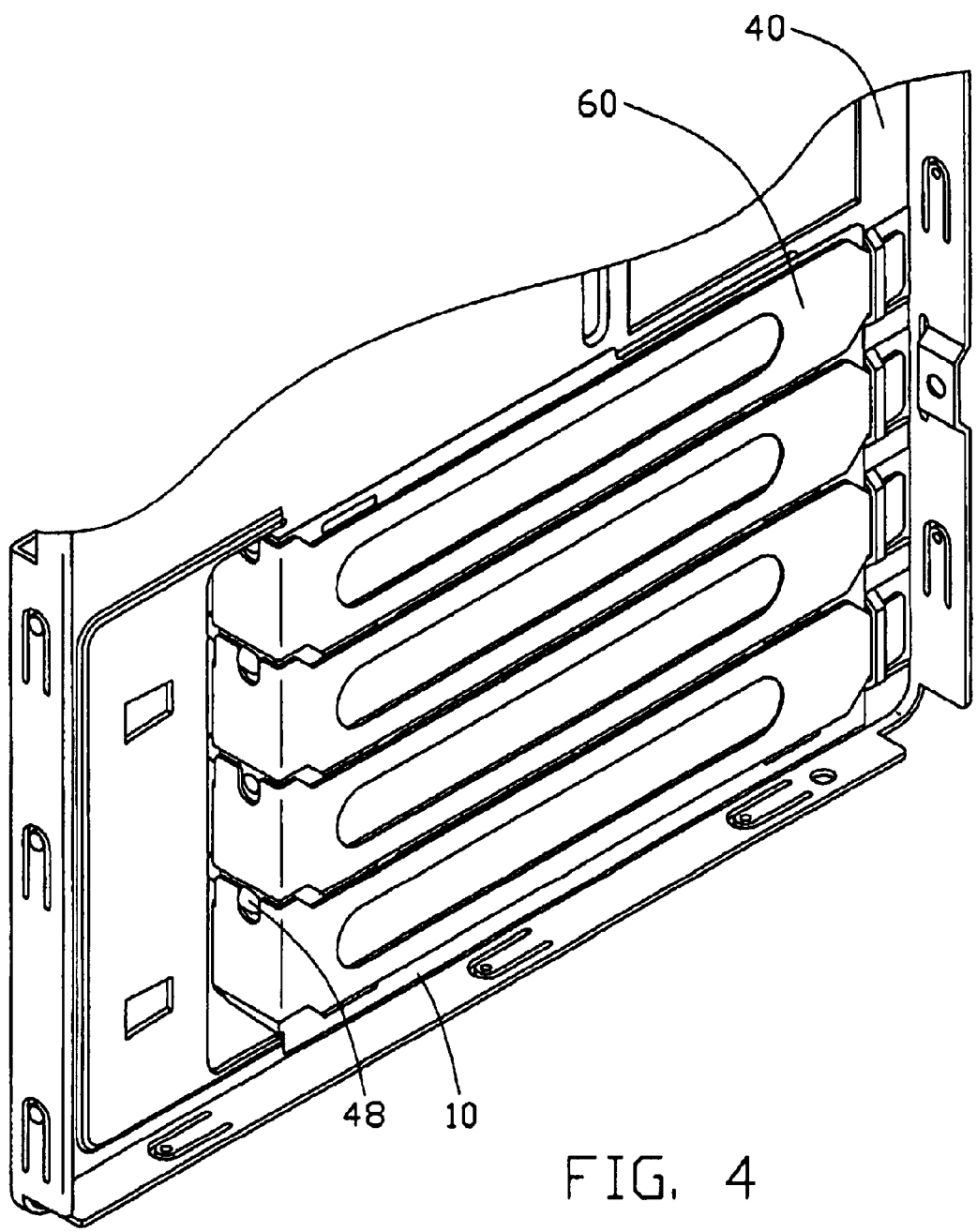
FIG. 4 is an assembled view of FIG. 1.
Figure 5:
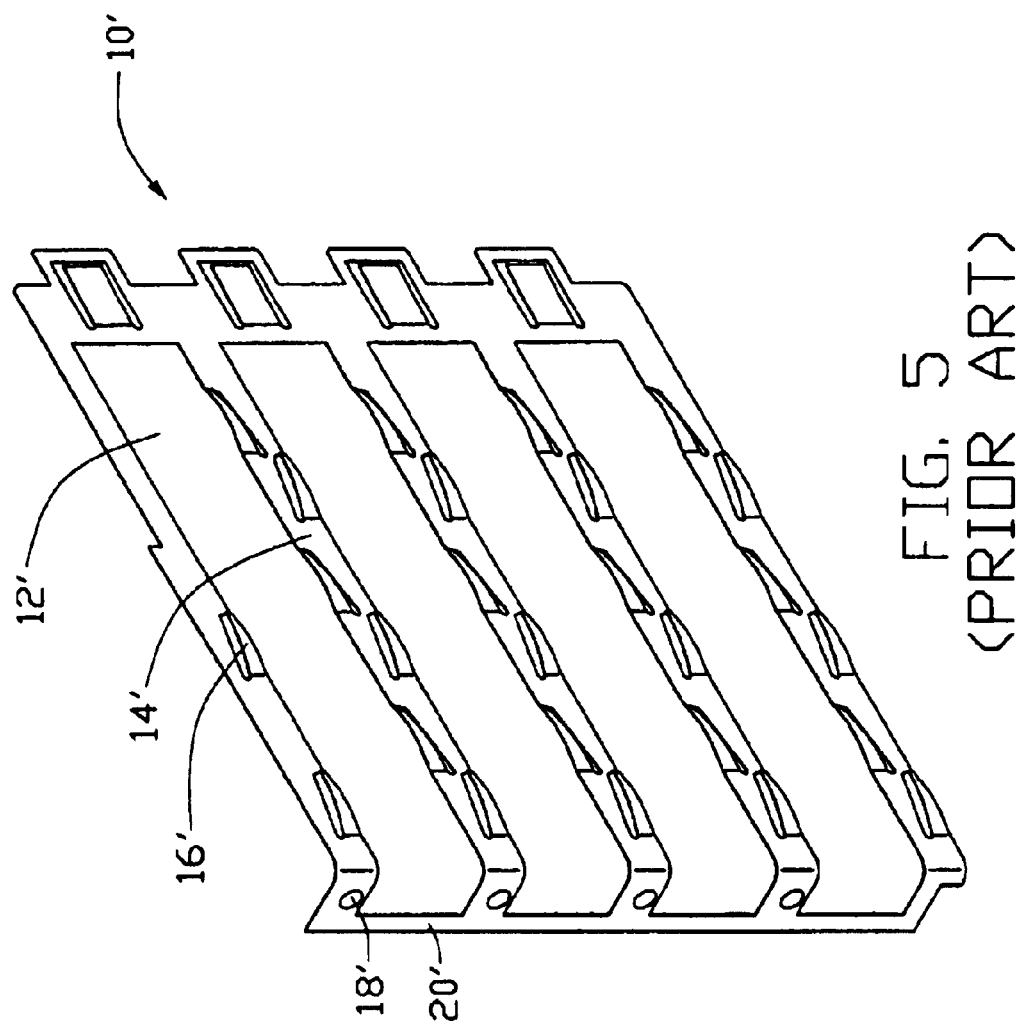
FIG. 5 is an isometric view of a conventional EMC shield of a computer enclosure.

Referring also to FIGS. 3 and 4, in pre-assembly, the EMC shield 10 is attached to the rear panel 40 with the hooks 20 of said other side of the EMC shield 10 engaging with the rear panel 40 at a corresponding common side of the expansion slots 42. Push the second bent portion 26 of the EMC shield 10 rearwardly until the hooks 20 on the second bent portion 26 engage with a corresponding common side of the expansion slots 42. Meanwhile, the fixing protrusions 48 of the rear panel 40 are fixed in the fixing holes 24 of the EMC shield 10, thereby preventing the EMC shield 10 from moving forwardly. The tabs 18 resiliently abut against the beams 44 of the rear panel 40 and the flakes 22 resiliently abut against the rear panel 40. In full assembly, the cover plates 60 are secured to the rear panel 40 and cover the corresponding expansion slots 42. The cover plates 40 depress the strips 16 of the EMC shield 10 so as to intimately contact the strips 16. The cover plates 40 also urge the EMC shield 10 together with the tabs 18 and the flakes 22 to intimately contact the rear panel 40. Thus, the EMC shield 10 reduces leakage of electromagnetic radiation through the expansions slots 42.

It is to be understood, however, that even though numerous characteristics and advantages of the present invention have been set forth in the foregoing description, together with details of the structure and function of the invention, the disclosure is illustrative only, and changes may be made in detail, especially in matters ape, size, and arrangement of parts within the principles of the invention to the full extent indicated by the broad general meaning of the terms in which the appended claims are expressed.

What is claimed is:

1. An assembly comprising:
    a rear panel defining a plurality of expansion slots and forming a plurality of beams alternating with the expansion slots, said rear panel bent rearwardly to form a first bent portion;
    an EMC shield defining a plurality of openings and forming a plurality of bars alternating with the openings, a second bent portion extending rearwardly from one side of the EMC shield corresponding to the first bent portion of the rear panel, said EMC shield comprising:
        at least one hooked tab folded back from the EMC shield at one side of one of the openings, the at least one hooked tab engaging with the rear panel,
        a plurality of first resilient members protruding outwardly and forwardly on said bars, and
        a plurality of second resilient members protruding outwardly and rearwardly on said bars.

2. The assembly in accordance with claim 1, wherein the EMC shield is integrally formed from a rectangular metal sheet.

3. The assembly in accordance with claim 1, wherein the first resilient members comprise a plurality of arch-shaped strips protruding slantingly outwardly and forwardly from both edges of each bar.

4. The assembly in accordance with claim 3, wherein the strips are symmetric in pairs.

5. The assembly in accordance with claim 1, wherein the second resilient members comprise a plurality of tabs protruding slantingly outwardly and rearwardly from both edges of each bar.

6. The assembly in accordance with claim 5, wherein the tabs are symmetric in pairs and alternating with the first members.

7. The assembly in accordance with claim 1, wherein a plurality of flakes protrudes slantingly outwardly and rearwardly from the other side of the EMC shield in some openings.

8. The assembly in accordance with claim 1, wherein a plurality of fixing holes is defined in the second bent portion of the EMC shield, and a plurality of fixing protrusions protrudes from the first bent portion of the rear panel corresponding to the fixing holes of the EMC shield.

9. An assembly comprising:
    a rear panel defining a plurality of expansion slots and forming a plurality of beams alternating with the expansion slots;
    an EMC shield defining a plurality of openings and forming a plurality of bars alternating with the openings, said EMC shield comprising:
    a plurality of first resilient members protruding outwardly and forwardly on said bars, and
    a plurality of second resilient members protruding outwardly and rearwardly on said bars; wherein
    the expansion slots are aligned with the corresponding openings, respectively, along a front-to-back direction, and the beams are aligned with the corresponding bars, respectively, along said front-to-back direction;
    wherein the first resilient members and the second resilient members are alternately arranged with each other; wherein said rear panel is bent rearwardly to form a first bent portion, and a second bent portion extends rearwardly from one side of the EMC shield corresponding to the first bent portion of the rear panel, further including a plurality of cover plates respectively covering the aligned corresponding opening and expansion slot under a condition that each of the bars are sandwiched between the corresponding cover plate and the corresponding beam wherein the first resilient members engage the corresponding cover plate and the second resilient members engage the corresponding beam.

10. The assembly in accordance with claim 9, wherein the shield includes at least one locking hook extending through the corresponding expansion slot to abut against a rear surface of the back panel while most portions of the shield are seated upon a front face of the back panel opposite to said rear face.

* * * * *